(12) United States Patent
Park et al.

(10) Patent No.: US 6,783,919 B2
(45) Date of Patent: Aug. 31, 2004

(54) STRIPPER COMPOSITION FOR PHOTORESIST

(75) Inventors: Hong-Sik Park, Yongin (KR); Sung-Chul Kang, Seungnam (KR); Hong-Je Cho, Suwon (KR); An-Na Park, Busan (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/301,973

(22) Filed: Nov. 21, 2002

(65) Prior Publication Data

US 2004/0101788 A1 May 27, 2004

(51) Int. Cl.[7] .............................. G03F 7/42; C11D 9/00; C02F 5/10
(52) U.S. Cl. .................. 430/318; 430/311; 430/325; 430/329; 430/331; 510/175; 510/176; 510/210; 510/254; 510/255; 510/258; 510/401
(58) Field of Search ................................. 430/329, 331, 430/311, 318, 325; 510/175, 176, 210, 254, 255, 258, 401

(56) References Cited

U.S. PATENT DOCUMENTS

| | | | | |
|---|---|---|---|---|
| 3,615,470 A | * | 10/1971 | Singletary | |
| 3,930,857 A | * | 1/1976 | Bendz et al. | |
| 4,201,579 A | * | 5/1980 | Robinson et al. | |
| 4,617,251 A | * | 10/1986 | Sizensky | 430/331 |
| 6,071,868 A | * | 6/2000 | Kim et al. | 510/176 |
| 6,140,027 A | * | 10/2000 | Baik et al. | 430/331 |
| 6,579,668 B1 | * | 6/2003 | Baik et al. | |

* cited by examiner

*Primary Examiner*—Richard L. Schilling
(74) *Attorney, Agent, or Firm*—Gray Cary Ware & Freidenrich LLP

(57) ABSTRACT

The invention relates to a TFT-LCD high-performance stripper composition for a photoresist, and more particularly to a stripper composition for a photoresist comprising: 20–60 wt % of monoethanolamine, 15–50 wt % of N,N-dimethylacetamide, 15–50 wt % of carbitol, and 0.1–10 wt % of gallic acid. The invention also provides a stripper composition for a photoresist comprising: 20–60 wt % of monoethanolamine, 15–50 wt % of N,N-dimethylacetamide, and 15–50 wt % of carbitol.

The stripper composition for a photoresist of the invention significantly reduces stripping time when applied to the TFT-LCD manufacturing process and leaves no impurity particles. By allowing the hard baking and ashing processes to be omitted, the gate process line can be simplified, which enables cost reduction. In addition, when it is applied to a process wherein silver (Ag) is used as reflective/transflective layer, it offers stripping ability and corrosion resistance of the pure Ag layer.

10 Claims, 5 Drawing Sheets

STRIPPER COMPOSITION FOR PHOTORESIST

BACKGROUND OF THE INVENTION (a) Field of the Invention

The present invention relates to a stripper composition for a photoresist, and more particularly to a stripper composition for a photoresist which is capable of simplifying a gate wiring process of a TFT-LCD circuit, a semiconductor IC, etc.

(b) Description of the Related Art

LCD circuits and semiconductor ICs have very fine structures. These fine-structured circuits are prepared by: coating or applying a photoresist uniformly on an insulation layer such as a metal oxide layer or on a conductive metal layer such as an aluminum alloy layer, formed on a substrate; exposing and developing the photoresist to form a pattern; and etching the metal layer or insulation layer using a mask. Then, the photoresist pattern is removed to obtain the circuit.

In general, a double conductive layer comprising an upper layer (the first conductive layer) of aluminum or an aluminum alloy such as Al-Nd, and a bottom layer (the second conductive layer) of chromium, molybdenum, or an alloy thereof, is used for the conductive metal layer for gate wiring in components such as an LCD, rather than a single metal layer.

Recently, silver (Ag), having better reflectivity than Al-Nd, has often been used as a reflective electrode. That is, with the growing importance of medium- or small-sized TFT-LCDs in regard to portability of mobile phones and PDAs (personal digital assistants), silver has come to be used in the reflective LCD to improve the panel characteristics. However, Ag is more difficult to process than Al, and it is easily corroded due to poor chemical resistance. In addition, the elution of silver causes contamination of the chemical bath and affects processes following, which brings about a reduction of the layer thickness and loss of CDs.

An example of the patterning processes of such gate wiring comprises deposition of a double metal layer on a semiconductor substrate, application of a photoresist, exposure, developing, etching of the first conductive layer, hard baking and ashing, stripping of the photoresist (PR strip), and etching of the second conductive layer. However, this process takes a substantial amount of time because the PR strip is performed after hard baking and ashing.

The stripper used to remove the photoresist pattern should have good stripping ability at both low and high temperatures. Also, it should not leave Impurity particles on the substrate or corrode metal layers such as Al or Ag. In addition, it is preferred to be environment-friendly and harmless to humans.

In order to satisfy these requirements, several photoresist stripper compositions have been developed and are used. For general production lines, a photoresist stripper composition comprising monoisopropanolamine (MIPA), N-methylpyrrolidone (NMP), and carbitol is used. Although this composition does not leave reactive Impurities, it is impossible to simplify the gate process. Also, for the Ag layer, excessive corrosion makes it impossible to use this composition.

For general mass-production lines, a stripper composition comprising monoethanolamine (MEA), N-methylpyrrolidone (NMP), butyldiflycol (BDG), and dimethylsulfoxide (DMSO) is used. However, this composition leaves reactive impurities and it is impossible to simplify the gate process. Furthermore, it is impossible to remove the DMSO included in the stripper.

For another method, there is a stripper composition comprising monoisopropanolamine (MIPA), N-methylpyrrolidone (NMP), carbitol, sulfones, and glycols. Although this composition does not leave reactive impurities, it is impossible to simplify the gate process. It is also expensive and cannot be prepared in a 20L container for production lines.

In addition, there is a stripper composition comprising several compounds including an organic amine, an organic solvent like DMF, and a surfactant. However, although this composition has good stripping ability, it cannot realize simplification of the process.

SUMMARY OF THE INVENTION

The present invention was made in consideration of the problems of the prior art, and it is an object of the present invention to provide a high-performance stripper composition for a photoresist capable of simplifying the gate process of double conductive layers for TFT-LCDs or semiconductor ICs by reducing the stripping time more than 50%, which can contribute to productivity improvement and cost reduction.

It is another object of the present invention to provide a semiconductor device preparing process which is capable of significantly improving productivity through simplification of the gate process, and which does not corrode metal layers like Ag.

It is another object of the present invention to provide a semiconductor device prepared by said method.

In order to achieve the objects, the present invention provides a stripper composition for a photoresist comprising 20 to 60 wt % of monoethanolamine, 15 to 50 wt % of N,N-dimethylacetamide, 15 to 50 wt % of carbitol, and 0.1 to 10 wt % of gallic acid.

Furthermore, the present invention provides a semiconductor device preparing process comprising a step of photoresist stripping using a stripper composition comprising 20 to 60 wt % of monoethanolamine, 15 to 50 wt % of N,N-dimethylacetamide, 15 to 50 wt % of carbitol, and 0.1 to 10 wt % of gallic acid.

Furthermore, the present invention provides a stripper composition for photoresist comprising 20 to 60 wt % of monoethanolamine, 15 to 50 wt/o of N,N-dimethylacetamide, and 15 to 50 wt % of carbitol.

Furthermore, the present invention provides a semiconductor device preparing process comprising a step of photoresist stripping using a stripper composition comprising 20 to 60 wt % of monoethanolamine, 15 to 50 wt % of N,N-dimethylacetamide, and 15 to 50 wt % of carbitol.

Furthermore, the present invention provides a semiconductor device prepared by said methods.

DETAILED DESCRIPTION OF THE PREFERRED EMBODIMENTS

Figure 1A:
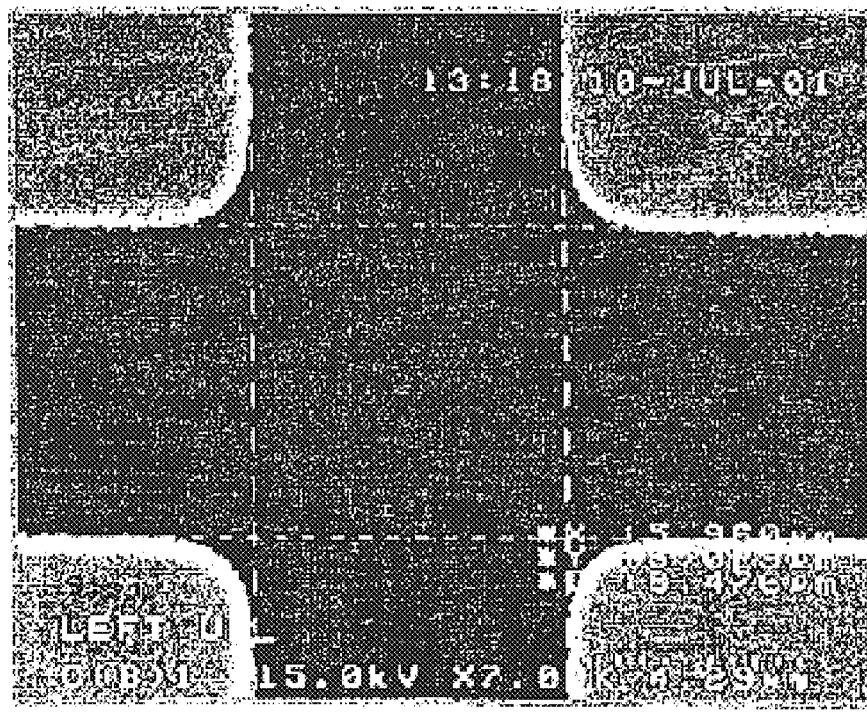
FIG. 1a is an electron-microscope photograph (×300) that shows the upper left part of a glass substrate on which the stripper composition for a photoresist of the present invention was applied to a pure Ag reflective layer.
Figure 1B:
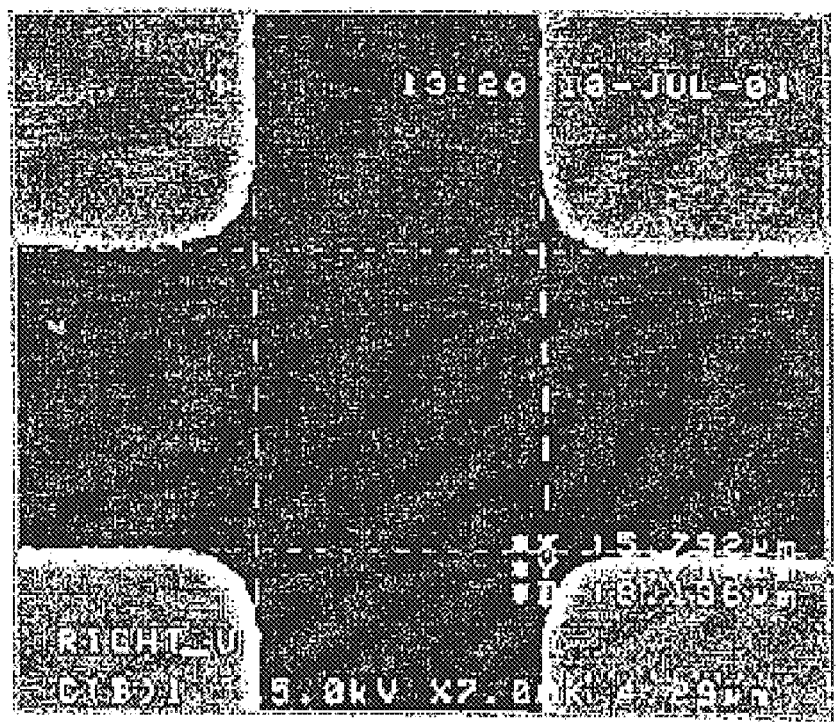
FIG. 1b is an electron-microscope photograph (×300) that shows the lower left part of the glass substrate on which the stripper composition for a photoresist of the present invention was applied to a pure Ag reflective layer.
Figure 1C:
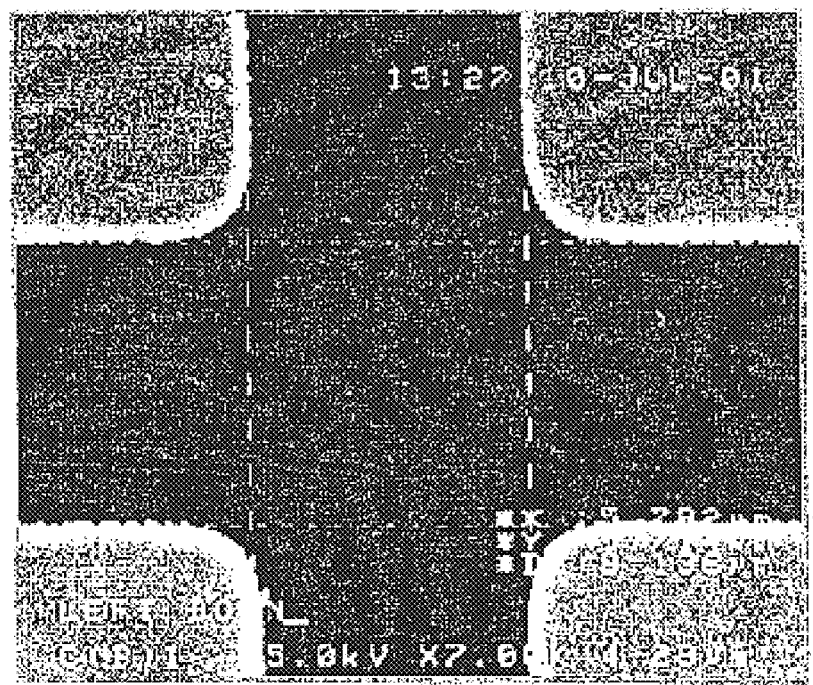
FIG. 1c is an electron-microscope photograph (×300) that shows the middle part of the glass substrate on which the stripper composition for a photoresist of the present invention was applied to a pure Ag reflective layer.
Figure 1D:
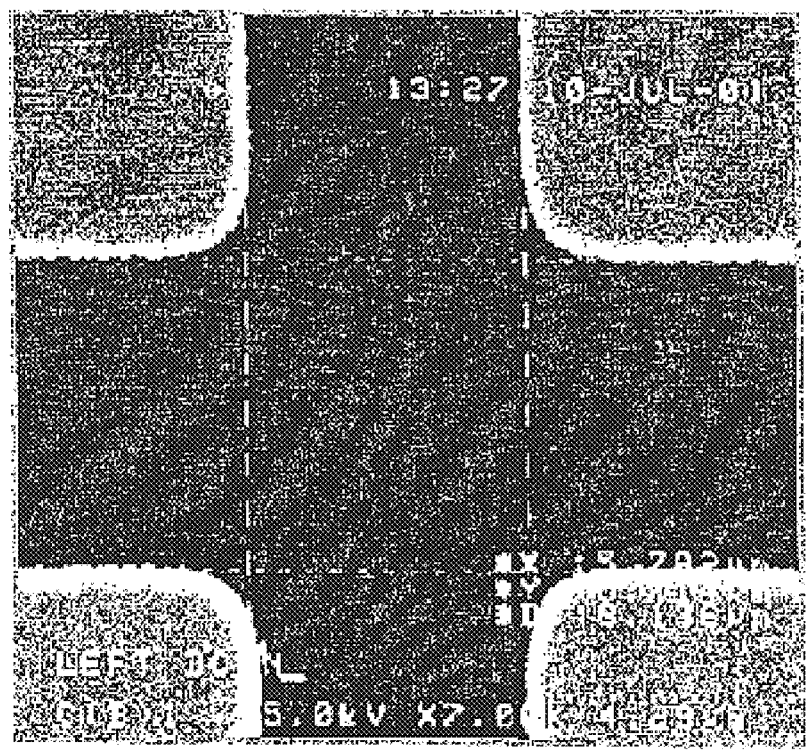
FIG. 1d is an electron-microscope photograph (×300) that shows the upper right part of the glass substrate on which the stripper composition for a photoresist of the present invention was applied to a pure Ag reflective layer.
Figure 1E:
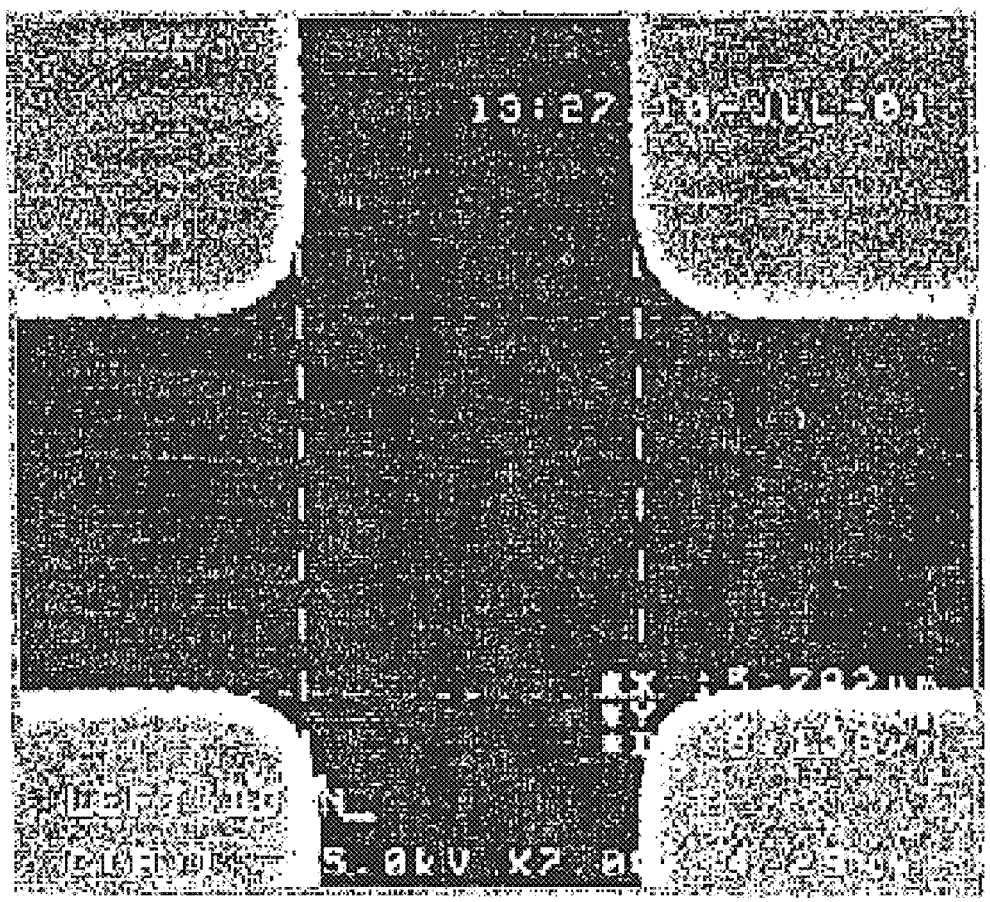
FIG. 1e is an electron-microscope photograph (×300) that shows the lower right part of the glass substrate on which the stripper composition for a photoresist of the present invention was applied to a pure Ag reflective layer.

The present invention will now be explained in more detail.

In order to solve problems of the conventional photoresist stripper compositions, the present inventors specified organic amines and organic solvents and adjusted their contents to improve the stripping ability. The resulting photoresist stripper composition can reduce stripping time in the gate process and simplify gate process lines of TFT-LCDs, etc.

The stripper composition for a photoresist of the present invention comprises 20 to 60 wt % of monoethanolamine, 15 to 50 wt % of N,N-dimethylacetamide, 15 to 50 wt % of carbitol, and 0.1 to 10 wt % of gallic acid.

The monoethanolamine (MEA) strips the photoresist during the gate process without leaving impurity particles. The content of the monoethanolamine is preferably 20 to 60 wt % of the total stripper composition, and more preferably 35 to 45 wt %. If the content is less than 20 wt %, the stripping ability is poor and photoresist particles remain, and if the content exceeds 60 wt %, the absorption to the photoresist is reduced.

The N,N-dimethylacetamide (DMAc) is a strong solvent, and its content is preferably 15 to 50 wt % of the total stripper composition, and more preferably 25 to 35 wt %. If the content is less than 15 wt %, the solubility of the photoresist is low, and if the content exceeds 50 wt %, the stripping ability is poor.

The solvent of the stripper composition for a photoresist of the present invention includes carbitol, which is a diethylene glycol monoethyl ether. It functions as a solvent that dissolves the photoresist, and it further improves stripping ability. The content of carbitol is preferably 15 to 50 wt % and more preferably 25 to 35 wt %. If the content is less than 15 wt %, the stripper composition is not absorbed in the photoresist well, and if the content exceeds 50 wt %, the stripping ability is poor.

Also, the stripper composition for a photoresist of the present invention includes gallic acid. Gallic acid prevents elution of silver (Ag), which is used as the reflective layer, during the gate process. thereby preventing its corrosion. The content of gallic acid is preferably 0.1 to 10 wt % of the total stripper composition, and more preferably 1.5 to 3.5 wt %. If the content is less than 0.1 wt %, the problem of silver corrosion arises, and if the content exceeds 10 wt %, the stripping ability is poor.

In one preferred embodiment of the present invention, the stripper composition comprises 35 to 45 wt % of monoethanolamine, 25 to 35 wt % of N,N-dimethylacetamide, 25 to 35 wt % of carbitol, and 1.5 to 2.5 wt % of gallic acid. Most preferably, the stripper composition comprises 40 wt % of monoethanolamine, 30 wt % of N,N-dimethylacetamide, 30 wt % of carbitol, and 2 wt % of gallic acid.

The stripper composition for a photoresist of the present invention may also comprise 20 to 60 wt % of monoethanolamine, 15 to 50 wt % of N,N-dimethylacetamide, and 15 to 50 wt % of carbitol.

The monoethanolamine (MEA) strips the photoresist during the gate process without leaving impurity particles. The content of monoethanolamine is preferably 20 to 60 wt % of the total stripper composition, and more preferably 35 to 45 wt %. If the content is less than 20 wt %, the stripping ability is poor and photoresist particles remain, and if the content exceeds 60 wt %, the absorption to the photoresist is poor.

The N,N-dimethylacetamide (OMAc) functions as a strong solvent. Its content is preferably 15 to 50 wt % of the total stripper composition, and more preferably 25 to 35 wt %. If the content is less than 15 wt %, the solubility of the photoresist is low, and if the content exceeds 50 wt %, the stripping ability is poor.

The stripper composition for a photoresist includes carbitol, a diethylene glycol monoethylether, in the organic solvent. Carbitol functions as a solvent the dissolves the photoresist, and it further improves the stripping ability of the composition. The content of carbitol is preferably 15 to 50 wt %, and more preferably 25 to 35 wt %. If the content is less than 15 wt %, the stripper composition is not absorbed in the photoresist well, and if the content exceeds 50 wt %, the stripping ability of the photoresist is poor.

A semiconductor device, preferably a TFT-LCD, can be prepared using the stripper compositions of the present invention, by removing the photoresist pattern.

For this purpose, the present invention forms a thin photoresist film on a semiconductor (glass) substrate, on which a conductive metal layer is formed, by spin-coaling a common photoresist composition on the substrate. For a glass substrate having a conductive metal layer, a common substrate having a double conductive layer comprising the first conductive layer (upper layer) of aluminum or an aluminum alloy such as Al—Nd, and the second conductive layer (bottom layer) of chromium, molybdenum, or an alloy thereof, a substrate having an ITO layer, and a substrate having an Ag reflective layer can be used. Among these, the substrate having an Ag reflective layer is preferred, but the present invention is not limited to such substrates.

The photoresist film on the semiconductor substrate is then exposed under normal exposure conditions. For example, light such as ArF and KrF laser, E-beam, X-ray, EUV, and DUV can be used.

The exposed photoresist film is then developed using an alkaline solution, and the photoresist pattern is removed using the stripper composition of the present invention by a common method, such as immersion or spraying, to prepare a semiconductor device. Then, the semiconductor device is washed with an organic solvent such as ultrapure water, acetone, or ethyl alcohol to remove impurities, and dried. For the alkaline solution, a common alkaline solution such as inorganic alkalis like sodium hydroxide, or quaternary ammonium solutions like tetramethylammonium hydroxide, can be used. But, it is not limited to such solutions.

The stripper composition of the present invention provides a good pattern formation even without hard baking and ashing processes before or after exposure.

As explained above, the stripper composition for a photoresist of the present invention uses specific organic amines and specific organic solvents in appropriate contents. Because it has good stripping ability, no impurity particles remain, and it offers an economical advantage through reduction of stripping time and simplification of processes (omission of hard baking and ashing processes). In addition, the stripper composition of the present invention can be applied to a variety of DVCs (digital video cassettes), such as Falcon, reflective/transflective Poly, PVA, TV, etc.

Hereinafter, the present invention is described in more detail through EXAMPLES and COMPARATIVE EXAMPLES. However, the following EXAMPLES are only for the understanding of the present invention, and the present invention is not limited to the following EXAMPLES.

EXAMPLES

Example 1 and Comparative Example 1

Photoresist stripper compositions for a Example 1 and Comparative Example 1 were prepared by compositions and contents as shown in Table 1.

Experimental Example 1

The stripper compositions of Example 1 and Comparative Example 1 were applied to the currently-used TFT gate process. A thin photoresist film of 1300Å thickness was formed by spin-coating on each of two glass substrates on which Ag had been deposited, and the films were exposed and developed by etching the Ag to obtain a certain pattern The glass substrates were then stripped by 10 spraying the stripper compositions of Example 1 and Comparative Example 1 respectively thereon, which had been heated to 60° C., and they were washed with ultrapure water. The stripping times are shown in Table 1.

TABLE 1

| Classification | | Example 1 | Comparative Example 1 |
|---|---|---|---|
| Contents (wt %) | MIPA$^1$ | — | 10 |
| | MEA$^2$ | 40 | — |
| | NMP$^3$ | — | 55 |
| | DMAc$^4$ | 30 | — |
| | Carbitol | 30 | 35 |
| | Gallic acid | 2 | — |
| Stripping time (sec) | | Bath 1/2 = 120°/120° | Bath 1/2 = 240°/240° |

Annotation)
1. MIPA: monoisopropanolamine
2. MEA: monoethanolamine
3. NMP: N-methylpyrrolidone
4. DMAC: N,N-dimethylacetamide As shown in Table 1, the stripping time (120"/1120") of the present invention (Example 1) was half that of Comparative Example 1.

Comparative Examples 2 and 3

Stripper compositions currently used in mass-production lines were prepared by compositions and contents as shown in Table 2.

Experimental Example 2

The stripper compositions of Example 1 and Comparative Examples 1 to 3 were applied to a TFT gate process wherein Ag was used as a reflective layer. The elution amount of Ag (at 70° C., dipping type; unit=ppb) according to time was analyzed by ICP, and the results are shown in Table 2. The number of photoresist-deposited glass substrates that can be treated is also shown in Table 2.

TABLE 2

| Classification | | Example 1 | Comp. Example 1 | Comp. Example 2 | Comp. Example 3 |
|---|---|---|---|---|---|
| Contents (wt %) | MIPA$^1$ | — | 10 | — | 10 |
| | MEA$^2$ | 40 | — | 20 | — |
| | NMP$^3$ | — | 55 | 40 | 50 |
| | DMAC$^4$ | 30 | — | — | — |
| | Carbitol | 30 | 35 | — | 13 |
| | BDG$^5$ | — | — | 20 | — |
| | DMSO$^6$ | — | — | 20 | — |
| | Sulfolane | — | — | — | 20 |
| | TEG$^7$ | — | — | — | 7 |
| Gallic acid (wt %) | | 2 | — | — | — |
| Ag elution amount (ppb) | 10 min | 61 | 3872 | 225 | 177 |
| | 30 min | 151 | 8793 | 876 | 352 |
| | 24 hr | 174 | 100% elution | 12983 | 1451 |
| | Number of treatable substrates | 1500 | 500 | 100 | 0 |

Annotation)
1. MIPA: monoisopropanolamine
2. MEA: monoethanolamine
3. NMP: N-methylpyrrolidone
4. DMAc: N,N-dimethylacetamide
5. BDG: butyldiflycol
6. DMSO: dimethyl sulfoxide
7. TEG: triethylene glycol As shown in Table 2, elution of Ag increases with time. In Comparative Example 1, 100% of the Ag was eluted after 24 hr, and the elution amounts of Comparative Examples 2 and 3 were also excessive. Furthermore, the number of glass substrates that can be treated by the Comparative Examples was only 0 to 500.

On the contrary, in Example 1, the use of gallic acid suppressed elution of Ag. Therefore, the stripper composition of Example I has much better Ag corrosion resistance, compared to Comparative Examples 1 to 3. In addition, the number of glass substrates that can be treated is much larger than that of Comparative Examples 1 to 3.

Experimental Example 3

A thin photoresist film of 20,000Å thickness was formed by spin-coating on a glass substrate on which Ag had been deposited, and the film was exposed and developed by etching the Ag to obtain a certain pattern. The glass substrate was then stripped by spraying the stripper composition of Example 1 thereon, which had been heated to 60° C., and the glass substrate was washed with ultrapure water and observed with an electron microscope. FIGS. 1a to FIG. 1e are electron-microscope photographs (×300) of upper left, lower left, middle, upper right, and lower right parts of the glass substrate whereon the stripper composition prepared in Example I was applied to the pure Ag reflective layer.

FIGS. 1a to 1e show that there are no impurity particles and the stripping was done very well. The biases were 5.87μm, 5.89 μm, 5.91 μm, 5.83 μm, and 5.87 μm, respectively, and there was no significant difference between the areas.

Experimental Example 4

The stripper compositions of Example 1 and Comparative Example 3 were evaporated at time intervals of 0, 1, 3, 6, and 24 hr, and strip tests were performed. Biases according to time were measured, and the results are shown in Table 3.

TABLE 3

| Classification | Initial | 1 hr | 3 hr | 6 hr | 24 hr |
| --- | --- | --- | --- | --- | --- |
| Example 1 | 5.83 | 5.84 | 5.88 | 5.86 | 5.89 |
| Comp. Example 3 | 5.89 | 5.81 | 5.86 | 5.93 | 7.29 |

(Unit: μm)

As shown in Table 3, the stripper composition of the present invention (Example 1) has better time stability than that of Comparative Example 3.

Experimental Example 5

Figure 2:
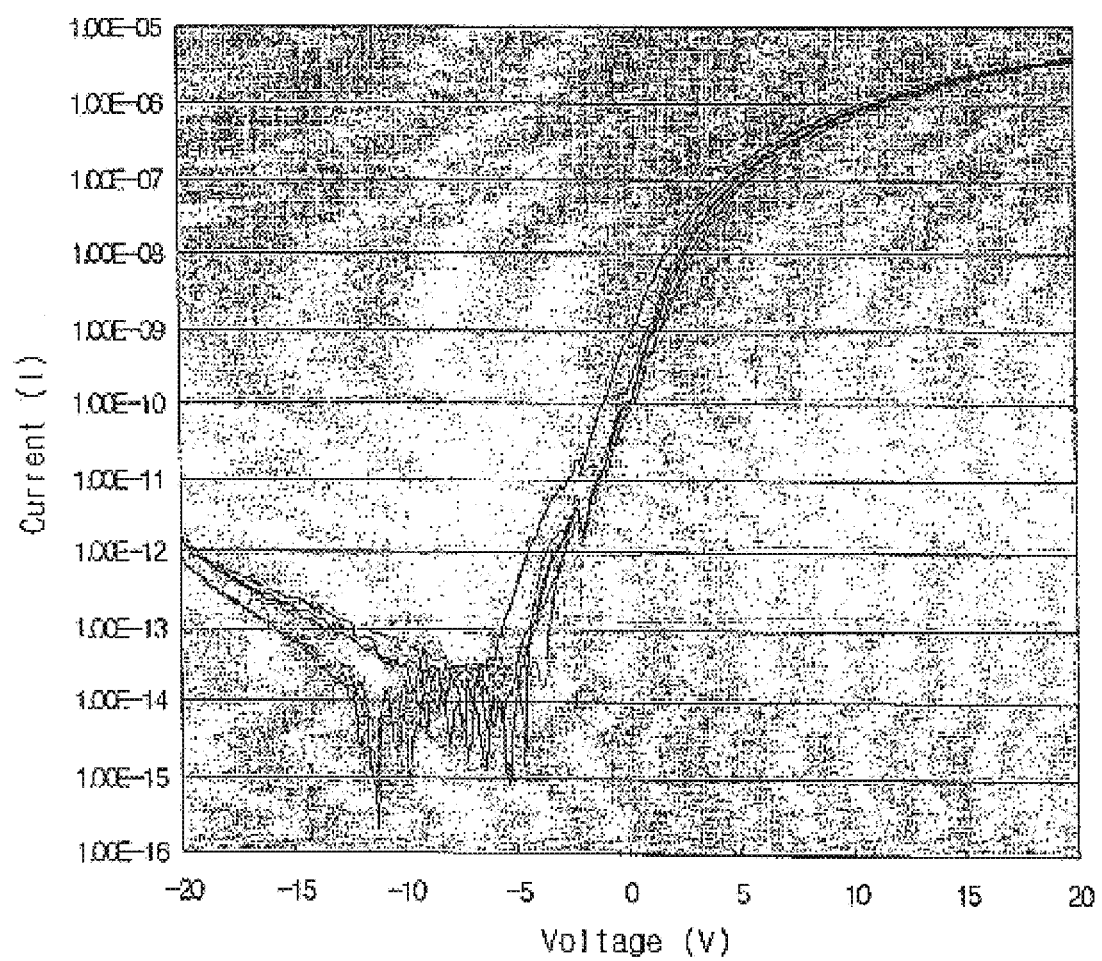
FIG. 2 shows EDS (I-V) characteristics of a 15.0" PVA DVC (digital video cassette) wherein the stripper composition for a photoresist of the present invention was used.
Figure 3:
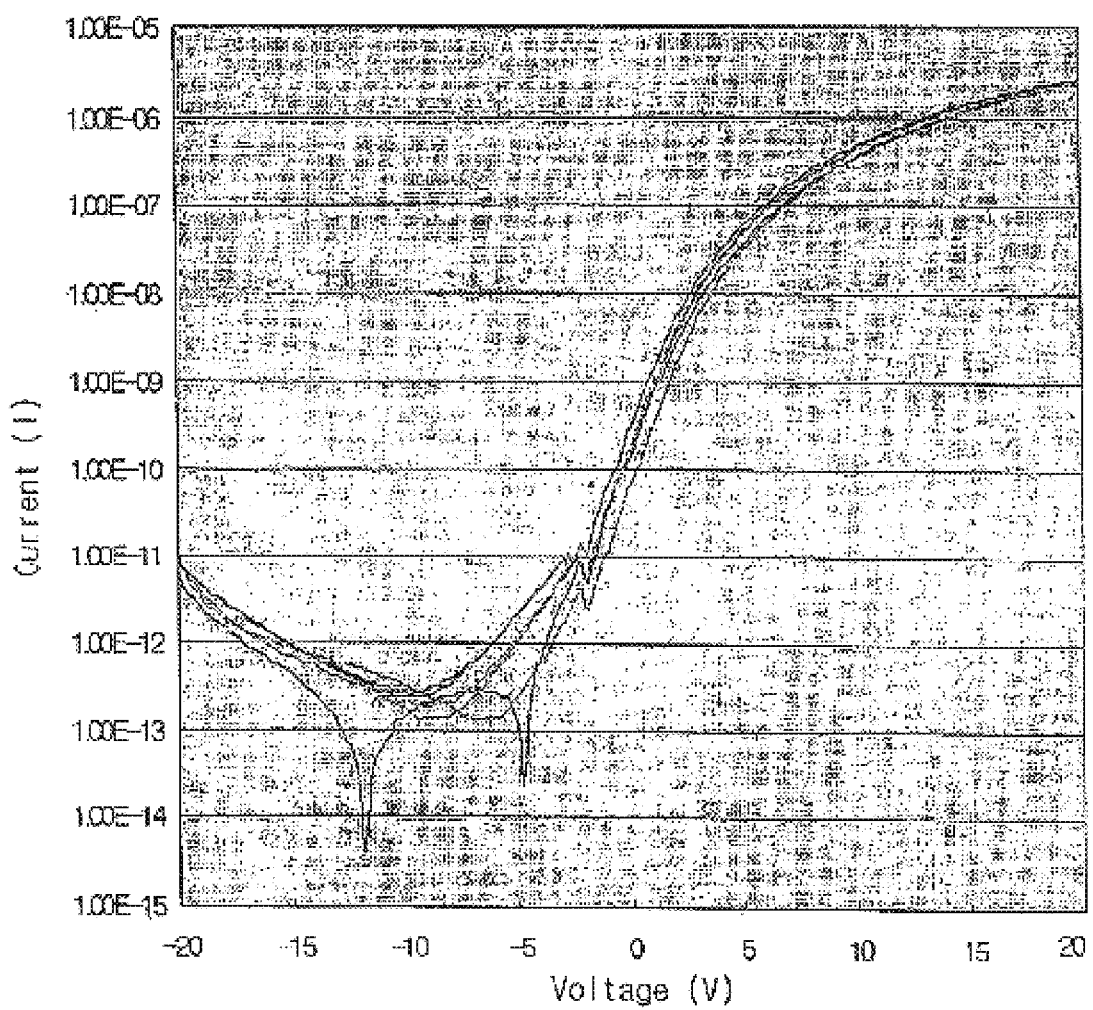
FIG. 3 shows EDS (I-V) characteristics of a 3.5" reflective DVC (digital video cassette) wherein the stripper composition for a photoresist of the present invention was used.

The stripper composition of Example 1 was used in the actual TFT-LCD manufacturing process, from the beginning to the TFT Fab Out, to obtain a 15.0" PVA and a 3.5" reflective DVC (digital video cassette). EDS (electric die sorting) tests were carried out on the products, and the results are shown in FIG. 2 and FIG. 3. As shown in FIG. 2 and FIG. 3, the 15.0" PVA DVC and the 3.5" reflective PVC prepared using the stripper composition of Example 1 had good current-voltage (I-V) characteristics.

Example 2 and Comparative Example 4

For an Ag reflective layer panel prepared using the stripper composition of Example 1, reflectivity was measured three times (Example 2). And, for an Al—Nd reflective layer prepared using the conventional stripper composition (Comparative Example 4), the reflectivity was measured twice. (LCD 5000; BaSO4 surface reflectivity= 100%). The results are shown in Table 4.

TABLE 4

| Classification | Example 2 | | | Comparative Example 4 | |
| --- | --- | --- | --- | --- | --- |
| Sample No. | #1 | #2 | #3 | #1 | #2 |
| Reflectivity (%) | 246 | 234 | 240 | 195 | 159 |

As shown in Table 4, the panel prepared using the stripper composition of the present invention (Example 1) has better reflectivity (234 to 246%) than the conventional Al—Nd panel.

Example 3 and Comparative Example 5

Photoresist stripper compositions of Example 3 and Comparative Example 5 were prepared by compositions and contents as shown in Table 5.

Experimental Example 6

The stripper compositions of Example 3 and Comparative Example 5 were applied to the currently used TFT gate process. A thin photoresist film of 1300Å thickness was formed by spin-coating on a glass substrate on which Ag had been deposited, and the film was exposed and developed by etching the Ag to obtain a certain pattern. The glass substrate was then stripped by spraying the stripper compositions of Example 3 and Comparative Example 5 thereon, which had been heated to 60° C. and it was washed with ultrapure water. The stripping time is shown in Table 5.

TABLE 5

| Classification | | Example 3 | Comparative Example 5 |
| --- | --- | --- | --- |
| Contents (wt %) | MIPA[1] | — | 10 |
| | MEA[2] | 40 | — |
| | NMP[3] | — | 55 |
| | DMAc[4] | 30 | — |
| | Carbitol | 30 | 35 |
| | Gallic acid | 2 | — |
| Stripping time (sec) | | Bath 1/2 = 120°/120° | Bath 1/2 = 240°/240° |

Annotation)
1. MIPA: monoisopropanolamine
2. MEA: monoethanolamine
3. NMP: N-methylpyrrolidone
4. DMAC: N,N-dimethylacetamide As shown in Table 5, the stripping time for the substrate of Example 3 (120/120") was half that of Comparative Example 5.

Comparative Examples 6 and 7

Stripper compositions currently used in mass-production lines were prepared by compositions and contents as shown in Table 6.

Experimental Example 7

The stripper compositions of Example 3 and Comparative Examples 5 to 7 were applied to a TFT gate process wherein Ag is used as reflective layer. The elution amount of Ag (at 70° C., dipping type; unit=ppb) according to time was analyzed by ICP, and the results are shown in Table 6. The number of photoresist-deposited glass substrates that can be treated is also shown in Table 6.

TABLE 6

| Classification | | Example 3 | Comp. Example 5 | Comp. Example 6 | Comp. Example 7 |
| --- | --- | --- | --- | --- | --- |
| Contents (wt %) | MIPA[1] | — | 10 | — | 10 |
| | MEA[2] | 40 | — | 20 | — |
| | NMP[3] | — | 55 | 40 | 50 |
| | DMAc[4] | 30 | — | — | — |
| | Carbitol | 30 | 35 | — | 13 |
| | BDG[5] | — | — | 20 | — |
| | DMSO[6] | — | — | 20 | — |
| | Sulfolane | — | — | — | 20 |
| | TEG[7] | — | — | — | 7 |
| Ag elution amount (ppb) | 10 min | 61 | 3872 | 225 | 177 |
| | 30 min | 151 | 8793 | 876 | 352 |
| | 24 hr | 174 | 100% ** | 12983 | 1451 |
| Number of treatable substrates | | 1500 | 500 | 100 | 0 |

Annotation)
1. MIPA: monoisopropanolamine
2. MEA: monoethanolamine
3. NMP: N-methylpyrrolidone
4. DMAc: N,N-dimethylacetamide
5. BDG: butyldiflycol
6. DMSO: dimethyl sulfoxide
7. TEG: triethylene glycol As shown in Table 6, elution of Ag increases with time. In Comparative Example 5, 100% of the Ag was eluted after 24 hr, and the elution amounts of Comparative Examples 6 and 7 were also excessive. Furthermore, the number of glass substrates that can be treated by the Comparative Examples was only 0 to 500.

Experimental Example 8

A thin photoresist film of 20,000Å thickness was formed by spin-coating on a glass substrate on which Ag had been deposited, and the film was exposed and developed by etching the Ag to obtain a certain pattern. The glass substrate was then stripped by spraying the stripper composition of Example 3 thereon, which had been heated to 60° C., and it was washed with ultrapure water and observed with an electron microscope in the same areas as in Experimental Example 3. There were no impurity particles and the stripping was done very well. The biases were 5.87 μm, 5.89 μm, 5.91 μm, 5.83 μm, and 5.87 μm, respectively, and there was no significant difference between the areas.

Experimental Example 9

The stripper compositions of Example 3 and Comparative Example 7 were evaporated at time intervals of 0, 1, 3, 6, and 24 hr, and strip tests were performed. Biases according to time were measured, and the results are shown in Table 7.

TABLE 7

| Classification | Initial | 1 hr | 3 hr | 6 hr | 24 hr |
|---|---|---|---|---|---|
| Example 3 | 5.83 | 5.84 | 5.88 | 5.86 | 5.89 |
| Comp. Example 7 | 5.89 | 5.81 | 5.86 | 5.93 | 7.29 |

(Unit: μm)

As shown in Table 7, the stripper composition of Example 3 has better time stability than that of Comparative Example 7.

Experimental Example 10

The stripper composition of Example 3 was used in the actual TFT-LCD manufacturing process, from the beginning to the TFT Fab Out, to obtain a 15.0" PVA and a 3.5" reflective DVC (digital video cassette). EDS (electric die sorting) tests were carried out on the products, and the results showed that the 15.0" PVA DVC and the 3.5" reflective DVC had good current-voltage (I-V) characteristics.

Example 4 and Comparative Example 8

For an Ag reflective layer panel prepared using the stripper composition of Example 3, reflectivity was measured three times (Example 4). And, for an Al—Nd reflective layer prepared using the conventional stripper composition (Comparative Example 8), the reflectivity was measured twice. (LCD 5000: BaSO4 surface reflectivity= 100%). The results are shown in Table 8.

TABLE 8

| Classification | Example 4 | | | Comp. Example 8 | |
|---|---|---|---|---|---|
| Sample No. | #1 | #2 | #3 | #1 | #2 |
| Reflectivity (%) | 246 | 234 | 240 | 195 | 159 |

As shown in Table 8, the panel prepared using the stripper composition of the present invention (Example 4) has better reflectivity (234 to 246%) than the conventional Al—Nd panel.

As mentioned above, the stripper composition for a photoresist of the present invention significantly reduces stripping time, when applied to the TFT-LCD manufacturing process. It also leaves no remaining impurity particles due to good stripping ability, and because the hard baking and ashing processes can be omitted, the gate process line can be simplified which enables cost reduction. In addition, when it is applied to a process wherein silver (Ag) is used as reflective/transflective layer, it offers stripping ability and corrosion resistance of the pure Ag layer.

What is claimed is:

1. A stripper composition for a photoresist, comprising:

(a) 20 to 60 wt % of monoethanolamine;

(b) 15 to 50 wt % of N,N-dimethylacetamide;

(c) 15 to 50 wt % of carbitol; and (d) 0.1 to 10 wt % of gallic acid.

2. The stripper composition for a photoresist according to claim 1, comprising:

(a) 35 to 45 wt % of monoethanolamine;

(b) 25 to 35 wt % of N,N-dimethylacetamide;

(c) 25 to 35 wt % of carbitol; and (d) 1.5 to 2.5 wt % of gallic acid.

3. A preparation method of a semiconductor device which comprises a step of photoresist stripping using a stripper composition comprising 20 to 60 wt % of monoethanolamine, 15 to 50 wt % of N,N-dimethylacetamide, 15 to 50 wt % of carbitol, and 0.1 to 10 wt % of gallic acid.

4. The preparing method of a semiconductor device according to claim 3, wherein the semiconductor device contains an Ag reflective layer.

5. The preparing method of a semiconductor device according to claim 3, wherein the method comprises a step of exposing with ArF, KrF, DUV, E-beam, or X-ray.

6. A stripper composition for a photoresist, comprising:

(a) 20 to 60 wt % of monoethanolamine;

(b) 15 to 50 wt % of N,N-dimethylacetamide; and (c) 15 to 50 wt % of carbitol.

7. The stripper composition for a photoresist according to claim 6, comprising:

(a) 35 to 45 wt % of monoethanolamine;

(b) 25 to 35 wt % of N,N-dimethylacetamide; and (c) 25 to 35 wt % of carbitol.

8. A preparation method of a semiconductor device which comprises a step of photoresist stripping using a stripper composition comprising 20 to 60 wt % of monoethanolamine, 15 to 50 wt % of N,N-dimethylacetamide, and 15 to 50 wt % of carbitol.

9. The preparing method of a semiconductor device according to claim 8, wherein the semiconductor device contains an Ag reflective layer.

10. The preparing method of a semiconductor device according to claim 8, wherein the method comprises a step of exposing with ArF, KrF, DUV, E-beam, or X-ray.

* * * * *